(12) United States Patent
Fenouillet-Béranger et al.

(10) Patent No.: US 8,368,128 B2
(45) Date of Patent: Feb. 5, 2013

(54) COMPACT FIELD EFFECT TRANSISTOR WITH COUNTER-ELECTRODE AND FABRICATION METHOD

(75) Inventors: Claire Fenouillet-Béranger, Saint Martin d'Hères (FR); Olivier Thomas, Revel (FR); Philippe Coronel, Barraux (FR); Stéphane Denorme, Crolles (FR)

(73) Assignees: Commissariat a l'Energie Atomique et aux Energies Alternatives, Paris (FR); STMicroelectronics (Crolles 2) SAS, Crolles (FR)

( * ) Notice: Subject to any disclaimer, the term of this patent is extended or adjusted under 35 U.S.C. 154(b) by 13 days.

(21) Appl. No.: 13/152,630

(22) Filed: Jun. 3, 2011

(65) Prior Publication Data

US 2011/0298019 A1 Dec. 8, 2011

(30) Foreign Application Priority Data

Jun. 3, 2010 (FR) ...................................... 10 02358

(51) Int. Cl.
*H01L 29/67* (2006.01)

(52) U.S. Cl. ........ 257/288; 438/180; 438/229; 438/299; 257/332; 257/346; 257/387; 257/E29.255; 257/E21.409; 257/E21.44; 257/E21.444; 257/E21.507

(58) Field of Classification Search .................. None
See application file for complete search history.

(56) References Cited

U.S. PATENT DOCUMENTS

| | | | |
|---|---|---|---|
| 6,504,173 B2 * | 1/2003 | Hsu et al. | ............... 257/60 |
| 6,611,023 B1 | 8/2003 | En et al. | |
| 2002/0043686 A1 | 4/2002 | Bolam et al. | |
| 2002/0185684 A1 | 12/2002 | Campbell et al. | |
| 2009/0129142 A1 | 5/2009 | Yamaoka et al. | |

FOREIGN PATENT DOCUMENTS

| | | |
|---|---|---|
| EP | 1 624 486 A1 | 2/2006 |
| FR | 2 912 548 A1 | 8/2008 |

* cited by examiner

*Primary Examiner* — Julio J Maldonado
*Assistant Examiner* — Yasser Abdelaziez
(74) *Attorney, Agent, or Firm* — Oliff & Berridge, PLC

(57) ABSTRACT

An etching mask, comprising the delineation pattern of the gate electrode, of a source contact, a drain contact and a counter-electrode contact, is formed on a substrate of semiconductor on insulator type. The substrate is covered by a layer of dielectric material and a gate material. The counter-electrode contact is located in the pattern of the gate electrode. The gate material is etched to define the gate electrode, the source contact and drain contacts and the counter-electrode contact. A part of the support substrate is released through the pattern of the counter-electrode contact area. An electrically conductive material is deposited on the free part of the support substrate to form the counter-electrode contact.

12 Claims, 9 Drawing Sheets

COMPACT FIELD EFFECT TRANSISTOR WITH COUNTER-ELECTRODE AND FABRICATION METHOD

BACKGROUND OF THE INVENTION

The invention relates to a method for fabricating a field effect transistor and to a field effect transistor comprising:
- a support substrate,
- a dielectric material film,
- a semi-conducting material separated from the support substrate by the dielectric material film,
- a gate electrode,
- an electric contact of the support substrate.

STATE OF THE ART

With the ever-continuous reduction of their size, active integrated circuit devices, such as transistors, are encountering physical phenomena resulting in parasite effects on the main electric characteristics of the devices, for example short-channel effect. In order to remedy a certain number of these drawbacks, different solutions are envisaged.

The substrates on which the transistors are integrated have been modified so as to reduce certain of the parasite phenomena of transistors. These improved substrates are of semi-conductor on insulator type. They are formed by a semi-conducting material layer separated from the support substrate by a dielectric material. Depending on the thickness of the semi-conducting material layer on which the field effect transistor is integrated, the substrate is said to be partially or fully depleted. Thus, for a fully depleted substrate, the conduction channel of the transistor occupies the whole thickness of the semi-conducting material (thin semi-conductor layer) whereas for a partially depleted substrate, the transistor channel only occupies a portion of the latter (thicker semi-conductor layer).

By successively using substrates of partially depleted then fully depleted semi-conductor on insulator type, it has been possible to pursue the race towards miniaturization and continuous improvement of transistors.

Substrates of fully depleted semi-conductor on insulator type were then modified by reducing the thickness of the dielectric material layer and integrating a doped layer in the support substrate. This doped layer is formed near the dielectric layer so as to form a ground plane. This ground plane enables better control of the parasite effects of the transistor integrated on the semi-conducting material layer, in particular the short-channel effect by means of improved control of drain electrode induced barrier lowering (DIBL). However, the use of a ground plane requires integration of an additional control electrode connected to this ground plane. This results in additional constraints at fabrication method level and also as far as the surface used by the transistor is concerned.

The document U.S. Pat. No. 6,611,023 describes a field effect transistor provided with a counter-electrode, this counter-electrode being formed beneath the conduction channel by doping of the support substrate. It is also formed underneath a part of an insulating pattern coating the device to enable a contact connection to be made. An electric connection is made between the counter-electrode and the gate electrode through the insulating pattern.

The transistor and its fabrication method are not optimum as it is not possible to electrically distinguish the gate electrode and counter-electrode to obtain a greater operating flexibility. Furthermore, it is necessary to pass through the insulating pattern to obtain control of the counter-electrode. This point is problematic when working in dense circuits as safety margins also have to be taken into account for this contact connection in the insulating pattern.

SUMMARY OF THE INVENTION

The object of the invention is to provide a method for fabricating a field effect transistor provided with a counter-electrode. This method enables a gain in compactness and is easy to implement.

To meet this requirement, the following steps are in particular performed:
- providing a substrate of semi-conductor on insulator type with a support substrate, a semi-conducting material layer, and a gate material,
- etching the gate material from an etching mask to define the delineation of a gate electrode and of a counter-electrode contact area in the gate material, the counter-electrode contact area being located in the pattern of the gate electrode,
- forming the counter-electrode contact in the counter-electrode contact area. This method performs self-alignment of the counter-electrode contact with respect to the gate electrode which enables a gain in compactness.

It is a further object of the invention to provide a field effect transistor that is provided with a counter-electrode electrically connected to the gate electrode and that is particularly compact and easy to fabricate. To meet this requirement, it is in particular provided for the support substrate electric contact to pass through the gate electrode and through the semi-conducting material film.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
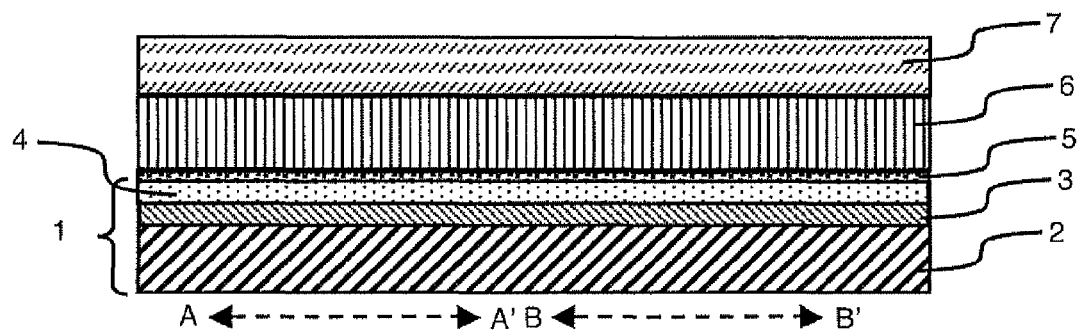
FIGS. 1 to 6 and 8 to 14 represent, in schematic manner in cross-section or in top view, particular steps of a fabrication method according to the invention.

The field effect device fabrication method according to the invention is performed starting from a substrate 1 which, as illustrated in FIG. 1, successively comprises a support substrate 2, for example made from semi-conducting material, a dielectric material layer 3, a semi-conducting material film 4, a gate dielectric material 5, a layer of gate material 6 and a masking layer 7. Masking layer 7 will act as hard mask and is for example made from an insulating material, for example a silicon nitride or a silicon oxide.

Figure 2:
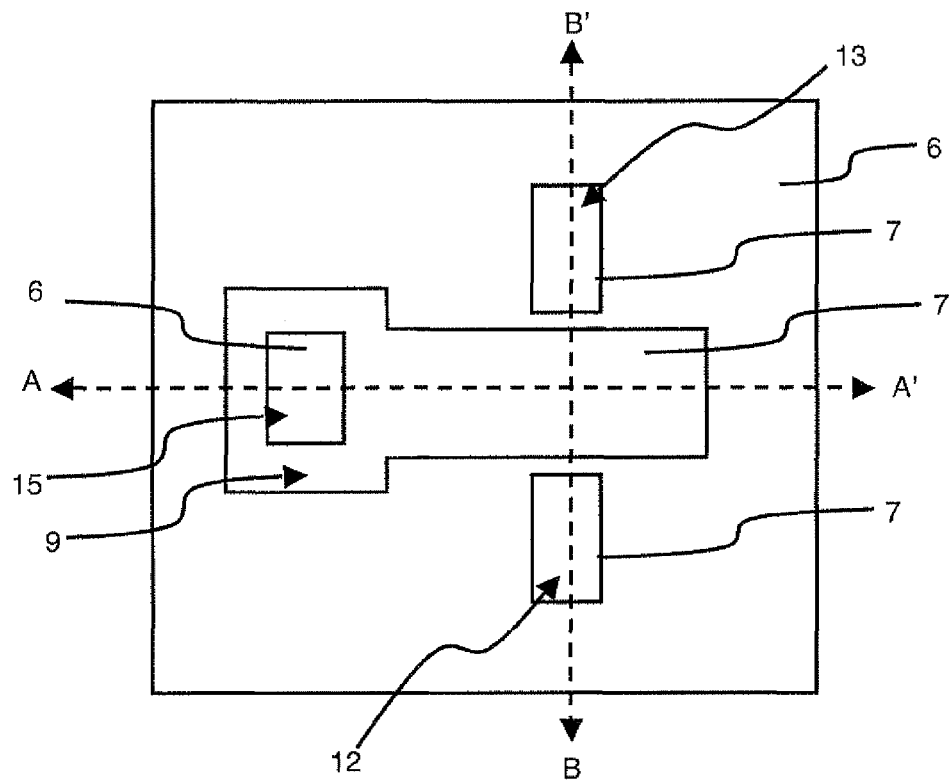
Figure 4:
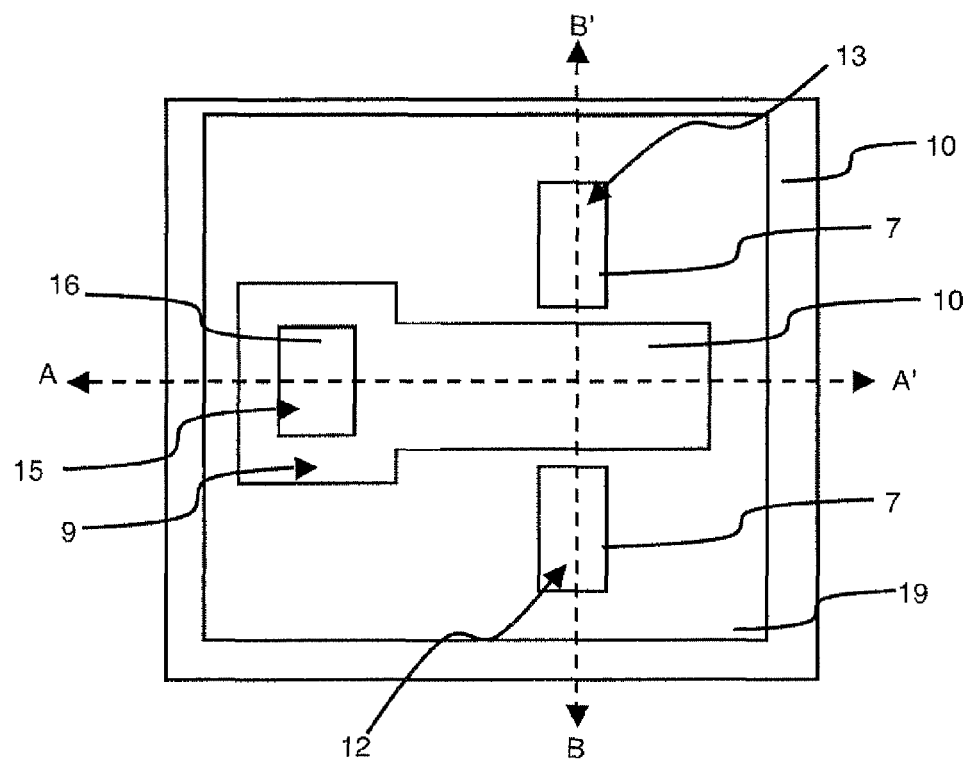

FIG. 1 represents cross-sectional views, from left to right, along the lines AA' and BB' illustrated in FIGS. 2 and 4 representative of top views of steps of the method.

Substrate 1 is thus a substrate of semi-conductor on insulator type that has been covered by a gate dielectric 5 and a material 6 able to act as gate electrode, this gate material 6 itself having been covered by a masking material 7 acting as hard mask. For example purposes, the gate dielectric has a thickness comprised between 1 and 3 nm, gate material 6 has a thickness comprised between 2 and 15 nm if it is a metal or a thickness comprised between 30 and 80 nm if it is a polycrystalline silicon. The masking material preferably has a thickness comprised between 20 and 50 nm.

Figure 3:
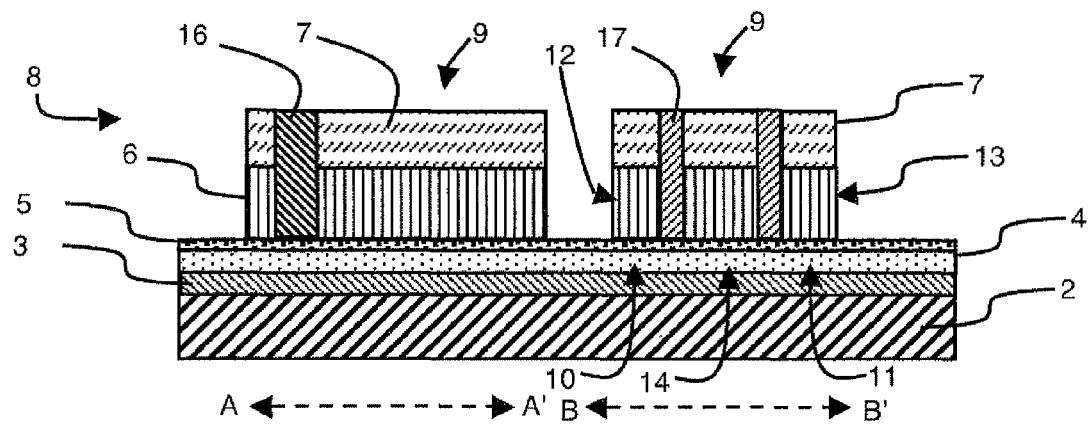

As illustrated in FIGS. 2 and 3, an etching mask 8 is formed in masking layer 7. Etching mask 8 enables the different elements forming the transistor, such as gate electrode 9, source 10 and drain 11 electrodes and source 12 and drain 13 contacts, to be defined and/or positioned with respect to one another. For example purposes, etching mask 8 is formed by photolithography and etching.

As illustrated in FIG. 2, etching mask 8 comprises the pattern delineating gate electrode 9. The pattern of gate electrode 9 serves the purpose of delineating conduction channel 14 and of positioning source 10 and drain 11 electrodes on each side of conduction channel 14 (FIG. 3). As illustrated in FIG. 3, source 10 and drain 11 electrodes and conduction channel 14 are located in semi-conducting material layer 4.

Etching mask 8 also comprises the pattern of the areas delineating the future source 12 and drain 13 contacts which will be formed on the source 10 and drain 11 electrodes.

Etching mask 8 further comprises the pattern of an access area 15, in the pattern of gate electrode 9, which will define the future counter-electrode contact. This access area 15 corresponds to a closed pattern formed inside the gate electrode. The pattern of access area 15 and that of gate electrode 9 are of opposite polarities.

By means of the pattern formed in etching mask 8, the position of source electrode 10 and drain electrode 11, and source contact 12 and drain contact 13, can be defined laterally with respect to gate electrode 9 with a single photolithographic level. Self-alignment of all the electrodes and of the contacts referred to above is therefore achieved. The dimensions of the different contacts can also be defined by means of this photolithographic level. The conventional pattern of gate electrode 9 is completed by the pattern of an access area 15 that is formed inside this gate electrode 9.

The shapes of gate electrode 9, source contact 12, drain contact 13 and access area 15 are represented in etching mask 8 by full or void areas of masking layer 7. Masking layer 7 acts as hard mask for the subsequent etching steps. Masking layer 7 is therefore chosen in a sufficiently strong material to be able to act as hard mask. Advantageously, to limit the technological steps, the areas representative of gate electrode 9 and of source contact 12 and drain contact 13 are represented by full areas in the etching mask (FIG. 3).

As illustrated in FIGS. 3 and 4, anisotropic etching is performed to pattern the layers disposed between etching mask 8 and gate dielectric layer 5, in the present case only gate material 6 is present between these two layers. The shape of gate electrode 9 is defined at the same time as the areas delineating source contact 12 and drain contact 13 by areas of gate material 6 and of masking material 7 as illustrated in FIG. 3 in cross-section. When delineation of gate electrode 9 is performed, delineation of access area 15 in gate electrode 9 is also performed. Source contact 12 and drain contact 13 are distinct patterns from that of the gate electrode in FIGS. 2 and 4, but they can also be joined to the gate electrode pattern and separated at a subsequent stage.

Once gate electrode 9 has been fabricated, and access area 15 (and source contact 12 and drain contact 13 if applicable) has been laterally delineated in masking layer 7 and gate material 6, masking of access area 15 is performed (and masking of the space existing between gate electrode 9 and the future source contact 12 and drain contact 13 if applicable).

The space between gate electrode 9 and the future source and drain contacts corresponds to the volume located between the side walls facing gate electrode 9 and each of source 12 and drain 13 contacts.

Masking can be performed in different manners. For example purposes, masking can be achieved by different additional photolithography steps which only leave access area 15 or the area situated between gate electrode 9 and source 12 and drain 13 contacts free. In this case, a first filling material 16 and a second filling material 17 are deposited in the areas left free. First filling material 16 fills the void area corresponding to access area 15 whereas second filling material 17 fills the two void areas located on each side of gate electrode 9 between gate electrode 9 and source 12 and drain 13 contacts. Second filling material 17 prevents short-circuiting between gate electrode 9 and source 12 and drain 13 contacts.

First filling material 16 is for example a material of silicongermanium alloy type. In general manner, first filling material 16 is formed by a material that can be eliminated selectively with respect to the other materials present.

Second filling material 17 is formed by a material that performs electric insulation between gate electrode 9 and source 12 and drain 13 contacts if the latter remains in the final structure. Second filling material 17 is for example a silicon oxide of TEOS type (tetraethylorthosilicate). If the second filling material is not kept in the final structure, it can be made from electrically conductive material. The choice of the first and second filling materials is made such that first filling material 16 can be eliminated selectively with respect to second filling material 17.

In a privileged embodiment, masking of access area 15 and masking of the areas between gate electrode 9 and source 12 and drain 13 contacts are performed without using any additional photolithographic level. Masking is performed using conformal deposition of material 16 or 17 used for filling the desired void area followed by partial etching of this same material, preferably isotropic etching with an etch stop detection. In order to master location of first filling material 16 and of second filling material 17, the minimum dimensions of access area 15 and the distance separating gate electrode 9 from source 12 and drain 13 contacts in etching mask 8, in a plane parallel to the surface of substrate 1, have to be defined. In preferred manner, to facilitate fabrication of the device, a distance of about 10 nm exists between the hole of access area 15 and each of source 12 and drain 13 contacts.

The void area presenting the smallest lateral dimension will be filled first. Thus, if first filling material 16 is to be deposited before second filling material 17, the size of access area 15 has to be dimensioned accordingly. Access area 15 will then present a smaller longitudinal and/or transverse dimension than the minimum distance separating gate electrode 9 from contacts 12 and 13. If first filling material 16 is to be deposited after second filling material 17, the constraints on the dimensions will be the opposite. In preferred manner, a safety margin comprised between 5 and 10% is used to ensure differentiation of the areas to be filled.

On the contrary, if the dimensions of access area 15 and if the distance between gate electrode 9 and source 12 and drain 13 contacts are fixed, the deposition order of materials 16 and 17 is imposed. Advantageously, first filling material 16 is deposited last, i.e. after second filling material 17.

The first deposited material (either of filling materials 16 and 17) is located in the required void area by means of conformal deposition followed by isotropic etching. In this way, once the void area with the smallest dimension has been filled by the deposited material, isotropic etching is performed. This isotropic etching eliminates the filling material except in the void area which it is sought to fill. An equivalent method is used to locate the subsequently deposited material.

Figure 5:
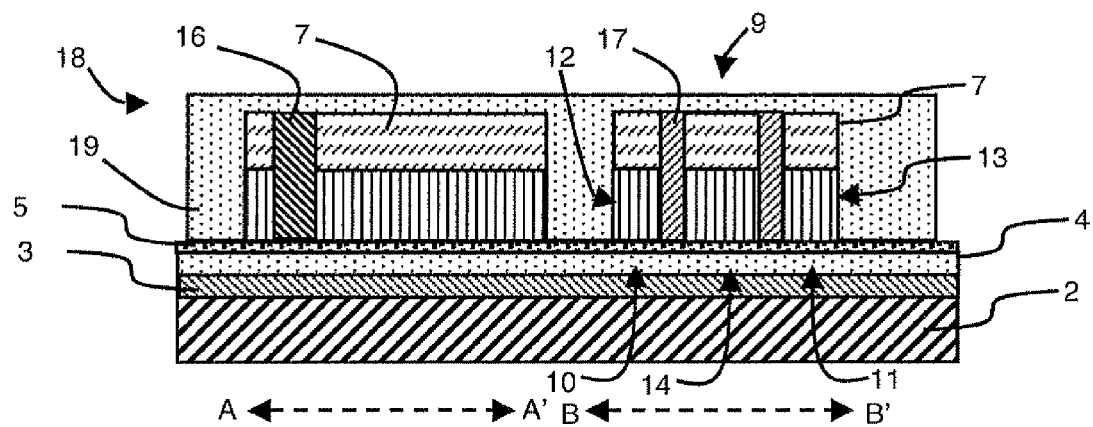

As illustrated in FIGS. 4 and 5, once first filling material 16 has been deposited and localized in access area 15, a delineation pattern 18 is formed. This delineation pattern 18 is achieved by a delineation material 19 that is deposited fullwafer. It is therefore deposited at least on gate dielectric 10 and on etching mask 8 and advantageously fills all the existing void areas. Delineation pattern 18 is formed around gate electrode 9 and around source 12 and drain 13 contacts.

Figure 6:
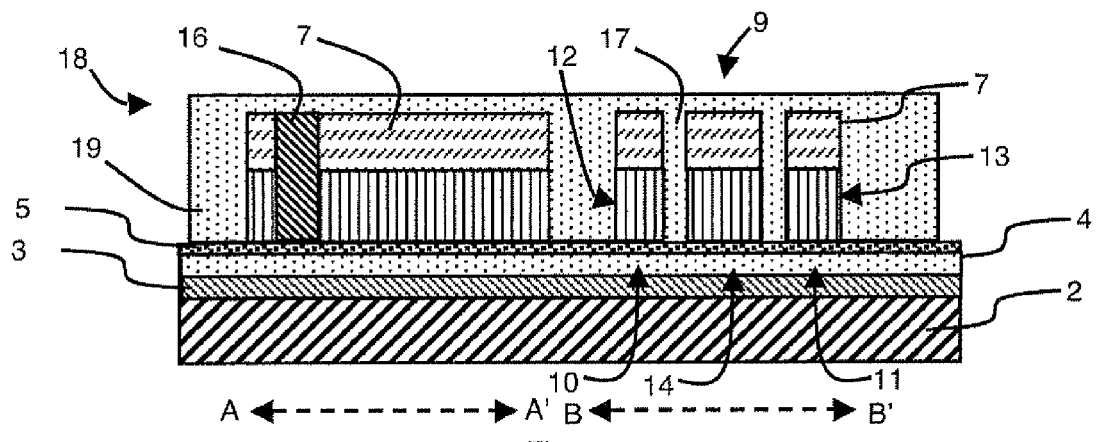

In a particular embodiment illustrated in FIG. 6, it is conceivable to leave the void areas between gate electrode 9 and source 12 and drain 13 contacts free before formation of delineation pattern 18. In this case, delineation material 19, which constitutes delineation pattern 18, also forms second filling material 17. Delineation pattern 18 is advantageously made from an electrically insulating material in order to also form an insulating pattern around gate electrode 9 and source 12 and drain 13 contacts. Thus, as a variant, second filling material 17 and delineation material 19 are deposited at different times and with materials that can be identical or different.

Figure 7:
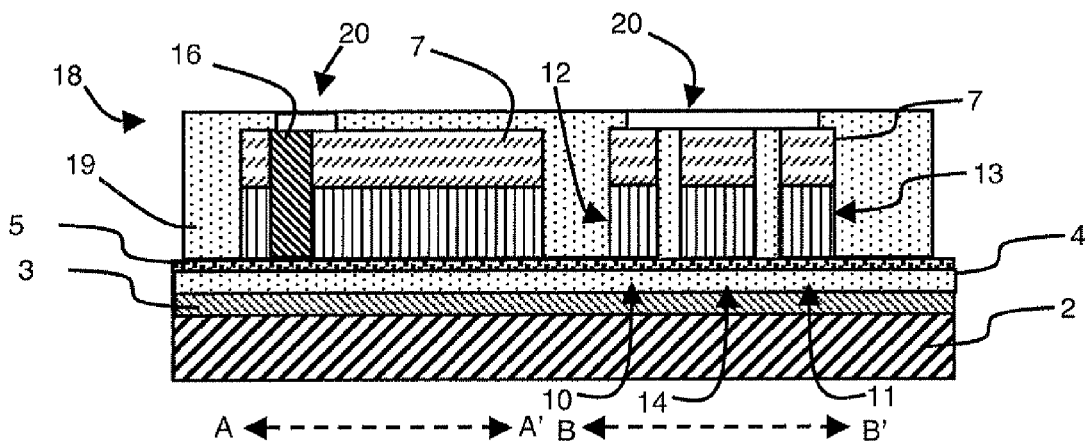
FIG. 7 represents, in schematic manner in cross-section, an alternative step to FIG. 6 in another fabrication method according to the invention.
Figure 8:
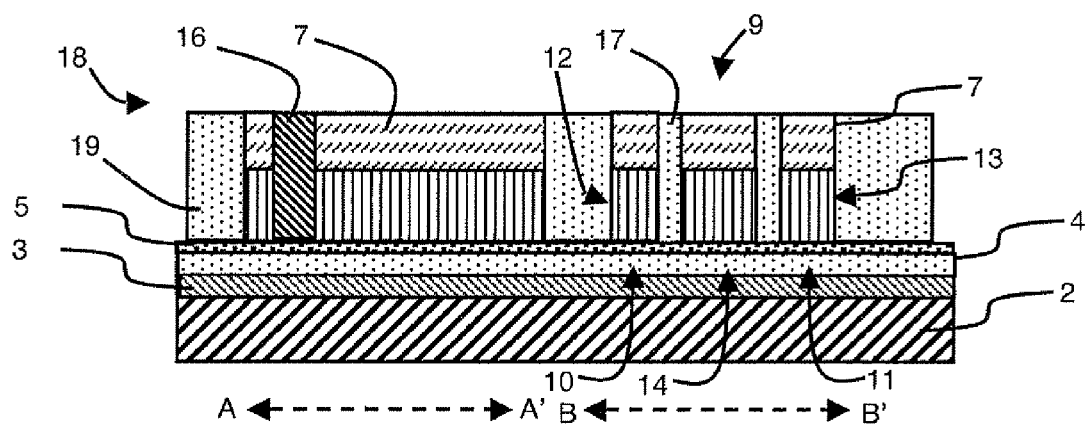

As illustrated in FIGS. 7 and 8, delineation pattern 18 is patterned so as to leave free (i.e. uncovered) a part of the top wall of gate electrode 9, a part of the top wall of first filling material 16, and a part of the top walls of source 12 and drain 13 contacts.

In a particular embodiment illustrated in FIG. 7, at least one opening 20 is then formed in delineation pattern 18 to uncover the required areas. In another particular embodiment illustrated in FIG. 8, the top walls of gate electrode 9, of source 12 and drain 13 contacts and of first filling material 16 are left totally free. This releasing is advantageously achieved by means of chemical mechanical polishing using masking layer 7 as stop layer. It is however conceivable to perform planarization of the top surface of delineation pattern 18 followed by an etching step that releases gate electrode 9, first filling material 16 and source 12 and drain 13 contacts.

If second filling material 17 is kept in the final structure, it is not necessary to perform at least partial releasing of its top surface. In the opposite case, a part of its top surface has to be released, this releasing however being able to be performed later on in the method.

Figure 9:
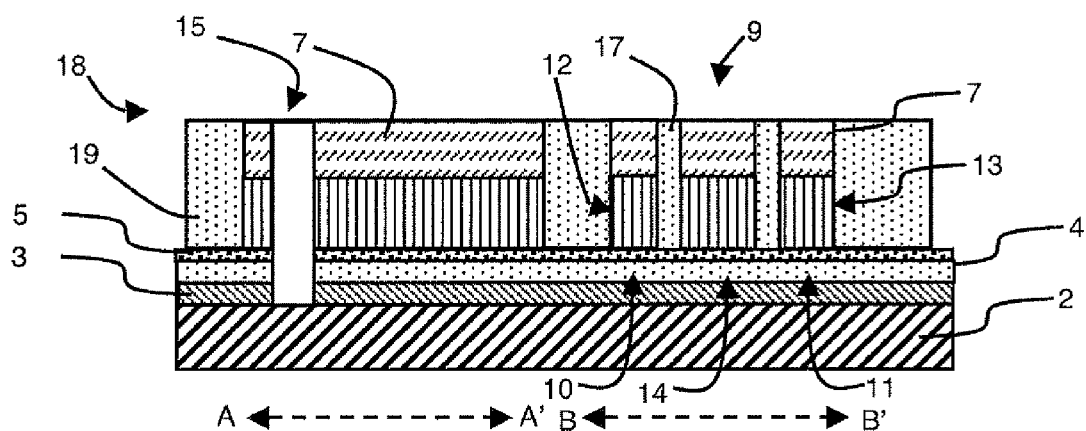
Figure 10:
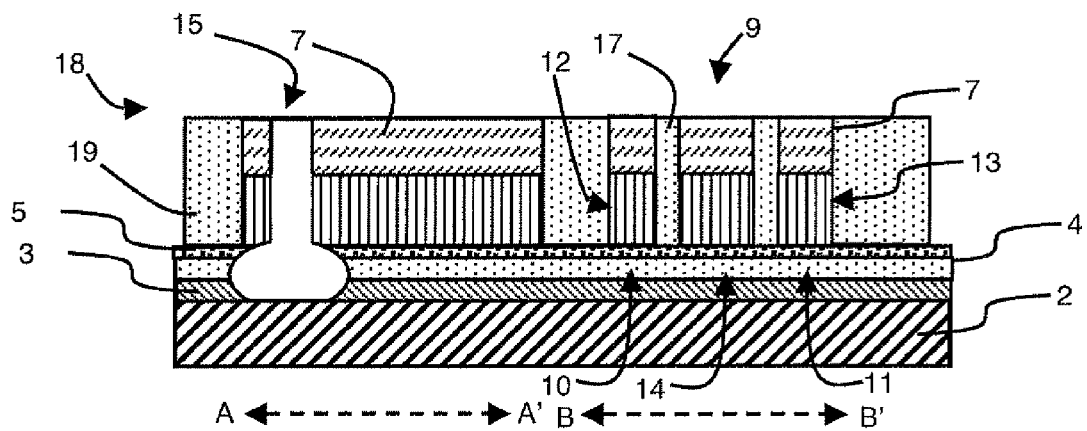

As illustrated in FIGS. 9 and 10, first filling material 16 is then eliminated allowing access to gate dielectric 5. Gate dielectric 5, semi-conducting material 4 and then dielectric material layer 3 are also subsequently eliminated at the level of access area 15. The etching operations can be performed in isotropic manner (FIG. 10) or anisotropic manner (FIG. 9) depending on the required configuration and/or the surface of open area in delineation pattern 18 above access area 15.

Once access to support substrate 2 has been made, a protective layer 21 is formed at least on the free areas of the electrically conductive materials accessible via access area 15 except for support substrate 2 and possibly gate electrode 9. In the configuration presented, a protective layer 21 has to be formed at least on semi-conducting material 4. This protective layer 21 can be formed by any suitable method, for example by means of selective oxidation of semi-conducting material layer 4 with respect to support substrate 2 and to gate material 6.

Figure 11:
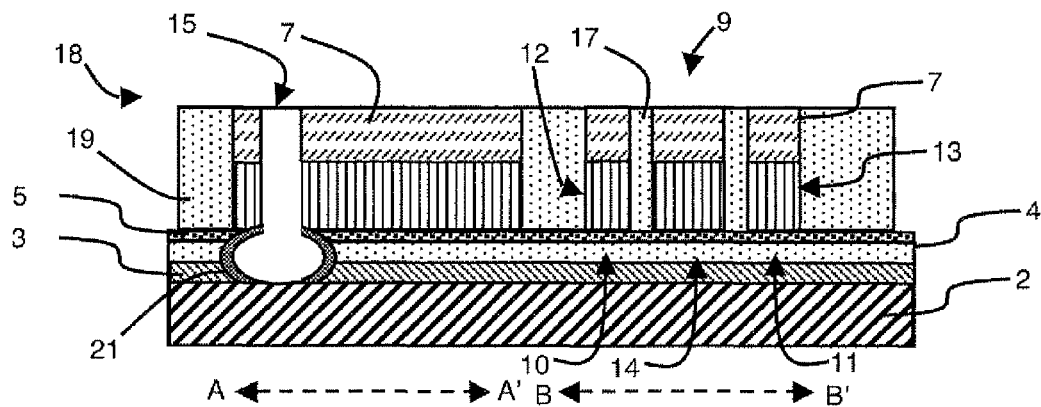

In a particular embodiment illustrated in FIG. 11, etching of semi-conducting material 4 has been performed in isotropic manner, which results in a more extensive void area in layers 3 and 4 than the surface of access area 15 in etching mask 8 (FIG. 10) and/or the associated opening 20 in delineation pattern 18. Protective layer 21 is then formed either by oxidation or by deposition of an electrically insulating material. The dielectric material formed is eliminated at the level of the surface of support substrate 2 by anisotropic etching. In this manner, the pattern of the free surface of the top wall of first filling material 16 (FIG. 7 or 8) corresponds to the pattern of the free area on the support substrate 2. Elsewhere, electrically insulating protective layer 21 is preserved. Protective layer 21 protects semi-conducting material layer 4 against short-circuiting and delineates the effective contact surface between support substrate 2 and the future counter-electrode contact.

Advantageously, to obtain a large effective contact, the whole of the top surface of access area 15 has to be released.

Figure 12:
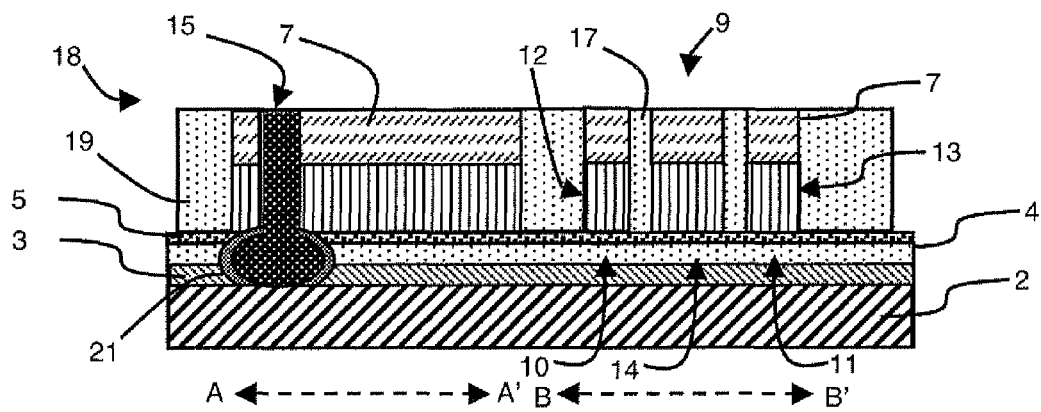

As illustrated in FIG. 12, once support substrate 2 presents a free area in access area 15 and protective layer 21 prevents any short-circuiting with at least semi-conducting material layer 4, the counter-electrode contact can be fabricated. Contact is made by deposition and patterning of a first electrically conducting material 22, for example a metal or a doped semi-conducting material. Advantageously, if support substrate 2 is made from silicon, or from silicon or germanium base material, deposition of material 22 is preceded by deposition of a thin layer of metal. This metal layer is subjected to heat treatment to form a silicide and/or germanide (not represented) which enhances the electric contact between support substrate 2 and the electric counter-electrode contact.

Figure 13:
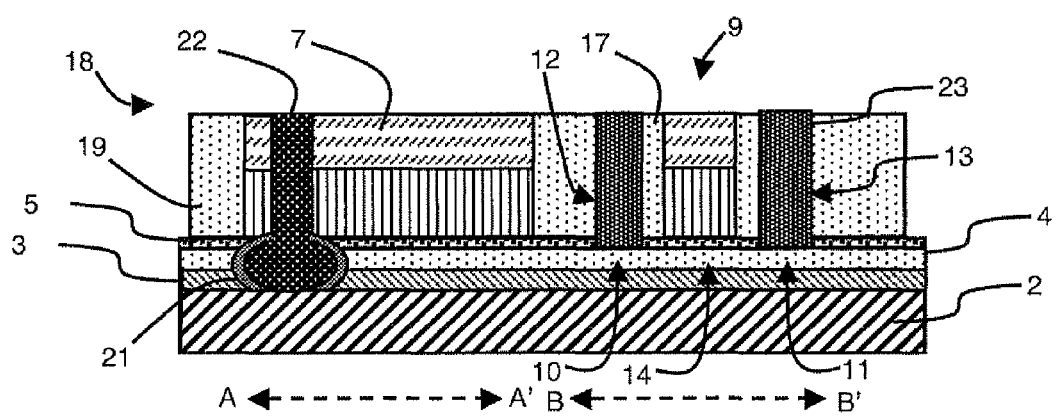

As illustrated in FIG. 13, the source 12 and drain 13 contact areas are then at least partly released in order to access gate material 6 present in the bottom of these areas. Releasing of source 12 and drain 13 contact areas is performed by any suitable technique, for example by means of a photolithography step which leaves the top surfaces of these areas uncovered. In preferential manner, different materials are located in contact areas 12 and 13 compared with that or those present at the level of the gate electrode. This point can be obtained by modulating the dimensions of the different contacts as was explained for locating first and second filling materials 16 and 17.

Gate material 6 and then gate dielectric 5 are then eliminated to release at least a part of semi-conducting material layer 4 that forms source electrode 10 and drain electrode 11 of the transistor. Here again, source contact 12 and drain contact 13 are fabricated in conventional manner by deposition of a second electrically conducting material 23, for example a metal or a doped semi-conducting material, identical to first electrically conductive material 22 or not. As before, deposition of this material can advantageously be preceded by formation of a silicide or a germanide. In this embodiment, source contact 12 and drain contact 13 and the counter-electrode contact, i.e. that of support substrate 2, are formed separately.

In the case where first material conductor 22 is deposited in directional manner, it is not necessary in the embodiment illustrated in FIG. 10 to provide a protective layer 21, as there cannot be any contact between this electrode and semi-conducting material 4.

Figure 14:
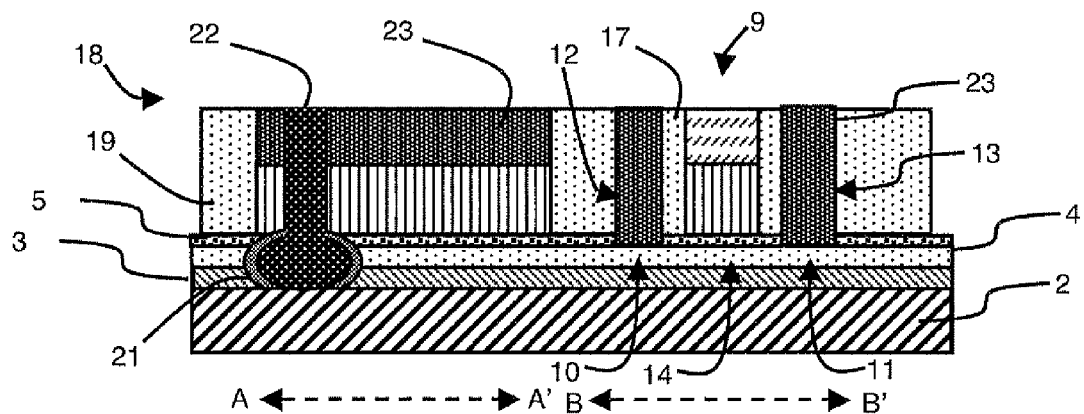

As illustrated in FIG. 14, the area delineating the future gate electrode 9 is also at least partially released to render a part of gate material 6 accessible and enable formation of the gate contact. Once at least partial etching of the masking material has been performed, access to gate material 6 is possible, and it can then be envisaged to replace the existing gate material 6 by another material and gate dielectric 5 can also be replaced by another material presenting more advantageous characteristics. An electrically conductive material can also be used, here for example second electrically conductive material 23 is used. In this way, when several transistors are formed on a substrate, the different transistors can be specialized by modifying the materials forming gate electrode 9.

Delineation pattern 18 and/or second filling material 17 can then be eliminated. The remainder of the transistor is fabricated in conventional manner.

In this way, source contact 12 is electrically connected to source electrode 10 and drain contact 13 is electrically connected to drain electrode 11. The counter-electrode contact is electrically connected to support substrate 2 without being connected to semi-conducting material layer 4.

Figure 15:
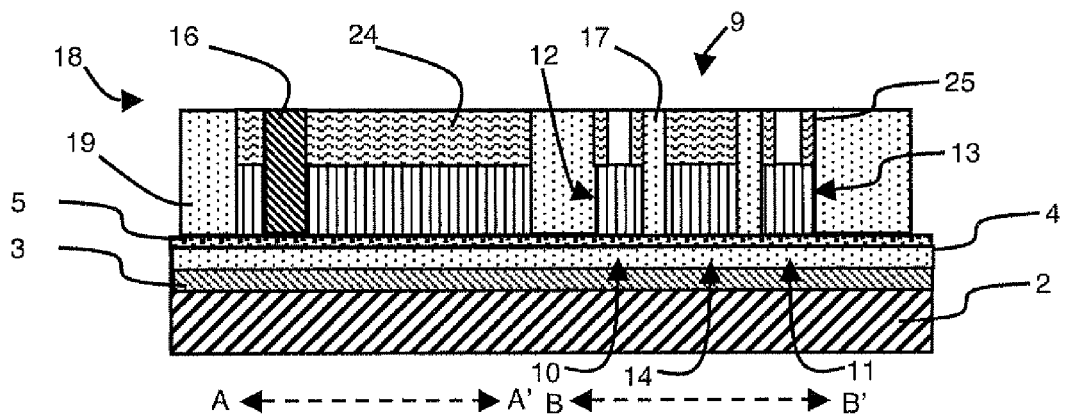
FIGS. 15 to 17 represent, in schematic manner in cross-section, a first alternative embodiment of a fabrication method according to the invention.
Figure 16:
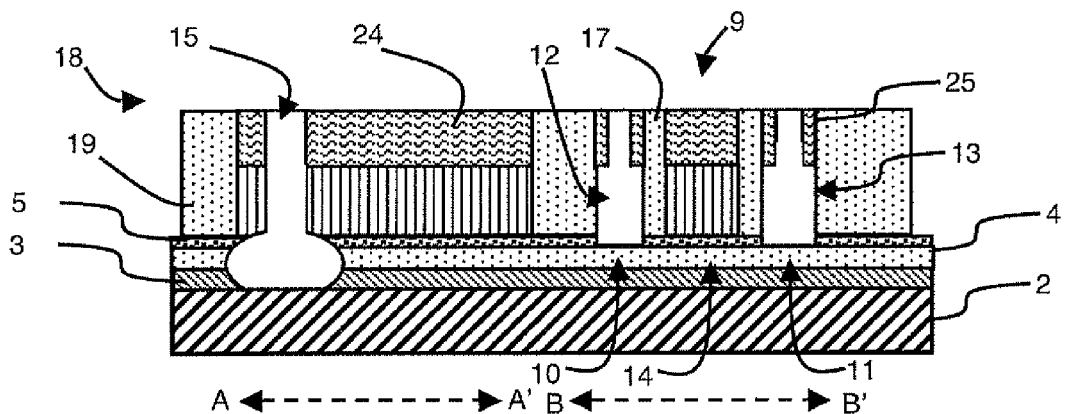
Figure 17:
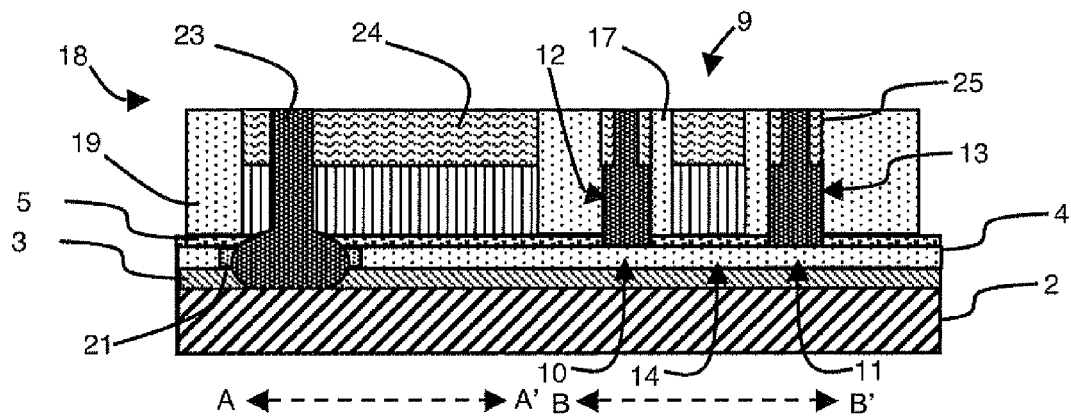

In another alternative embodiment illustrated in FIGS. 15 to 17, the counter-electrode contact is formed at the same time as source contact 12 and drain contact 13. Gate electrode 9 and source 12 and drain 13 contacts are then formed by the same electrically conductive material.

Once delineation pattern 18 has been formed, the latter is patterned to release the top surface of access area 15, of gate electrode 9 and of source 12 and drain 13 contacts. Patterning is achieved by a planarization step associated or not with an etching step. There are then at the surface of the substrate, first filling material 16, etching mask 8 and second filling material 17 (FIG. 8).

Etching mask 8 is then eliminated which makes gate material 6 and a part of the side walls of first filling material 16 and of second filling material 17 accessible.

As illustrated in FIG. 15, a covering material 24 is then deposited in conformal manner on the free surfaces. This covering material 24 has a constant thickness and it reproduces the initial surface topography. The deposited thickness of covering material is such that the void area representative of gate electrode 9, inside delineation pattern 18, is refilled. In this manner, in delineation pattern 18 at the level of gate electrode 9, etching mask 8 has been totally replaced by covering material 24. The shape of gate electrode 9 is preserved.

On the other hand, source 12 and drain 13 contact areas presenting lateral and longitudinal dimensions that are both larger than the smallest of the dimensions of the lateral and longitudinal dimensions of gate electrode 9, there is then formation of a lateral spacer 25 on the side walls. This lateral spacer 25 reduces the accessible surface of gate material 6, but does not refill this contact area. It is also possible by means of an additional photolithography step to localize the covering material in gate electrode 9 only, thereby preventing formation of a lateral spacer 25 in source 12 and drain 13 contact areas. Material 24 is then deposited by any suitable technique.

Once gate electrode 9 has been covered by covering material 24, first filling material 16 is eliminated, thereby making gate dielectric 5 accessible in access area 15 which is then eliminated.

As illustrated in FIG. 16, gate material 6 of contact areas 12 and 13 and semi-conducting material layer 4 underneath access area 15 are eliminated. In advantageous manner, if gate material 6 and semi-conducting material layer 4 are made from the same material or react to the same etching chemistry, these two materials can be eliminated at the same time. Etching can be anisotropic or isotropic.

If anisotropic etching is used to eliminate gate material 6 and if spacers 25 exist in covering material 24, there is formation of spacers made from gate material 6 on the side walls of the contact areas. In the absence of these spacers, gate material 6 is totally eliminated from the contact area.

If isotropic etching is used to eliminate gate material 6 in the source 12 and drain 13 contact areas, the presence or not of spacers 25 made from covering material 24 is of no consequence. It should however be observed that there will be consumption of gate material 6 from the free surface of access area 15.

Semi-conducting material layer 4 is patterned to render a part of dielectric material layer 3 accessible. Dielectric material layer 3 is also patterned to allow access to support substrate 2. The extent of support substrate 2 that is accessible depends on the etching methods used. Advantageously, the etching methods used to eliminate dielectric material layer 5 and semi-conducting material layer 4 are of isotropic type in order to increase the released surfaces.

Once gate dielectric 5 is accessible in contact areas 12 and 13, it can be eliminated. It is advantageous to eliminate gate dielectric 5 and dielectric material layer 3 at the same time if the latter are materials that react to the same etching chemistries.

Once support substrate 2 is accessible in access area 15, protective layer 21 has to be formed to prevent any short-circuiting between support substrate 2 and the other electrodes. As explained in the foregoing, the protective layer is made from electrically insulating material and is localized. Localization of protective layer 21 can be achieved by selective formation and/or by generalized formation followed by patterning.

Protective layer 21 prevents any electric contact between semi-conducting material layer 4 and support substrate 2. Protective layer 21 can also prevent electric contact between gate electrode 9 and support substrate 2.

Protective layer 21 is formed for example by oxidation or nitridation of semi-conducting material layer 4, i.e. by superficial transformation of semi-conducting material layer 4 into an electrically insulating material. The same is the case for superficial transformation of gate material layer 6 into an electrically insulating material. If during this transformation, support substrate 2 is also transformed, protective layer 21 formed on support substrate 2 is at least partially eliminated to allow access to a part of support substrate 2. This access can be achieved by anisotropic plasma etching which only eliminates protective layer 21 visible from the top of access area 15. It is also conceivable to obtain this access by anisotropic wet etching or by anisotropic plasma etching if protective layer 21 presents a larger thickness near the areas to be covered compared with support substrate 2. It is also to obtain this access by anisotropic wet etching or by plasma etching if protective layer 21 presents a difference of composition allowing a faster etching rate close to support substrate 2 compared to the other covered areas. In this way, protective layer 21 is at least localized on the edge of semi-conducting material layer 4.

If semi-conducting material layer 4 is not accessible in the contact areas, it has to be uncovered. Gate dielectric 5 in the contact areas is eliminated at the latest in this step, but it can be eliminated beforehand, for example when etching dielectric material layer 3.

As illustrated in FIG. 17, from this structure, source contact 12, drain contact 13 and counter-electrode contact can be produced simultaneously as all the electrodes are accessible. These contacts are formed for example by deposition of an electrically conductive material, for example second electrically conductive material 23, here a metal. Localization of the electrically conductive material to form specific contacts is advantageously achieved by a chemical mechanical polishing step that uses delineation pattern 18 as stop layer.

Advantageously, a silicidation step is performed on the free areas of semi-conductor 4 material before deposition of a metal to improve the electric contact. A silicide is thus formed on semi-conducting material layer 4 in source 12 and drain 13 contact areas, on support substrate 2 in access area 15 and in gate electrode 9, provided these materials can react with a metal to form a silicide or any other material with metallic behavior made from a semi-conducting material base.

Figure 18:
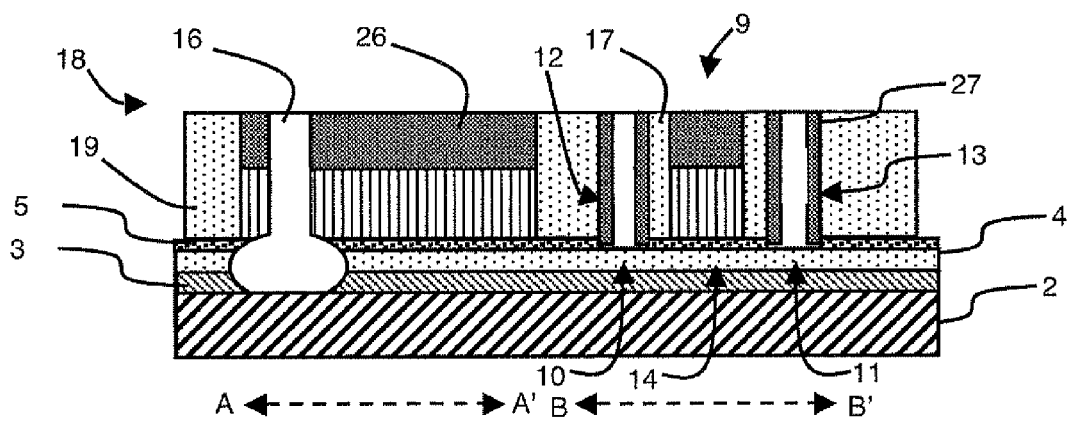
FIG. 18 represents, in schematic manner in cross-section, a second alternative embodiment of a fabrication method according to the invention.

In another alternative embodiment illustrated in FIG. 18, a layer of second covering material 26 is deposited and patterned. The deposited thickness is chosen such that the layer of second covering material 26 forms lateral spacers 27 in source 12 and drain 13 contact areas and fills the empty volume of gate electrode 9. In this way, the top of gate electrode 9 is covered by second covering material 26 which prevents the subsequent formation of a gate contact. This embodiment is therefore only of interest if the counter-electrode contact formed in access area 15 electrically connects gate electrode 9 by means of their common side walls.

The void areas present in source 12 and drain 13 contact areas are then filled by an electrically conductive material which forms effective source 12 and drain 13 contacts. These source 12 and drain 13 contacts are separated from gate electrode 9 by the thickness of second filling material 17 and by the thickness of lateral spacer 27 made from second covering material 26. These two thicknesses enable the value of the stray capacitances that exist between source 12 and drain 13 contacts and gate electrode 9 to be controlled.

Depending on the embodiments used, it is possible with few additional steps to obtain either a gate electrode and a counter-electrode completely dissociated from an electric point of view or electrically connected electrodes. To obtain electric independence between the gate electrode and counter-electrode contact, it is necessary to have an electrically insulating layer between first electrically conductive material 22 and the materials forming gate electrode 9.

Figure 19:
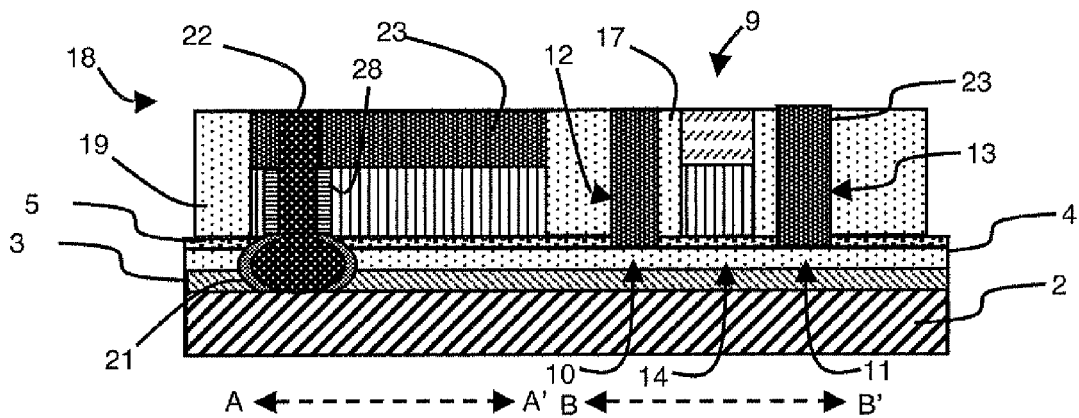
FIGS. 19 and 20 represent, in schematic manner in cross-section, third and fourth alternative embodiments of a fabrication method according to the invention.

As illustrated in FIG. 19, this electrically insulating layer can be formed by protective layer 21 and at least one other insulating material 28. For example, if protective layer 21 is formed by oxidation of a semi-conducting or conducting material, there can be formation of protective layer 21 on the free side walls of semi-conducting material layer 4 and of another insulating material 28 on the walls of gate material 6. Patterning of electrically insulating layer enables an electric insulator to be localized on the edges of semi-conducting material layer 4 and on the edges of gate material 6 while at the same time releasing at least a part of support substrate 2.

Figure 20:
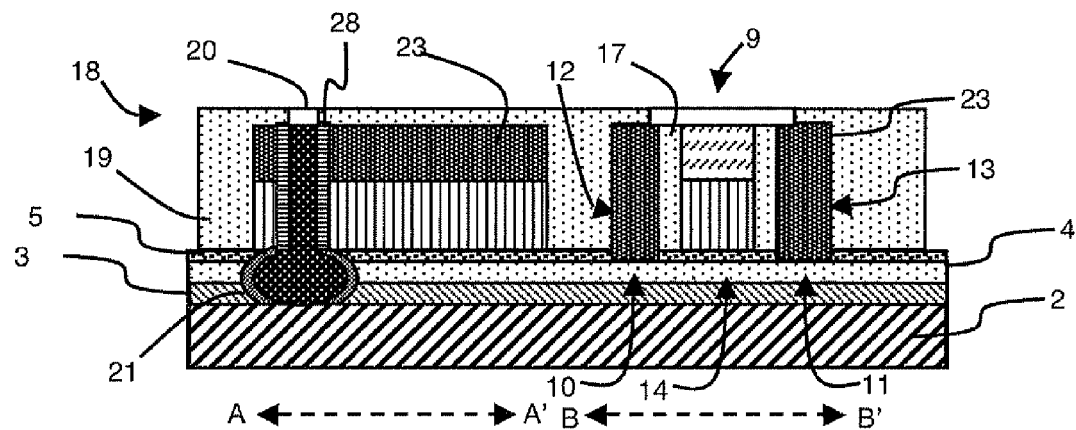

As illustrated in FIG. 20, the electrically insulating film can also be formed by protective layer 21 and possibly by another insulating material 28 if opening 20 formed in delineation pattern 18 is smaller than the extent of access area 15. Opening 20 formed above access area 15 therefore does not release a part of etching mask 8 around access area 15. When anisotropic etching of first filling material 16 is performed, there is formation of a continuous film of material 28 on the wall of access area 15, i.e. first sealing film 16 covers the side wall of gate material 6 and of etching mask 8. Protective layer 21 and/or material 28 can be formed by first filling material 16 if the latter is electrically insulating or by transformation, for example oxidation, of first filling material 16. Release of a part of support substrate 2 is advantageously achieved by means of anisotropic etching.

In an alternative embodiment, not represented, the insulating film can also be formed after the counter-electrode contact has been produced once gate material 6 has been eliminated. In this case, it is necessary to release access to the side walls of the counter-electrode contact. This can be achieved by eliminating the materials forming the gate electrode and by conformal deposition of an electrically insulating material. This insulating layer can advantageously be formed by the gate dielectric when the latter is deposited.

It is thus possible, as illustrated for example in FIGS. 14, 17 and 19, to obtain a field effect transistor comprising a gate electrode 9 and a counter-electrode. The transistor successively comprises a support substrate 2, a dielectric insulating material layer 3, and a semi-conducting material film 4. Semi-conducting material film 4 is separated from support substrate 2 by dielectric material layer 3 and is covered by the layer of gate dielectric material 5 and gate material 6. Gate electrode 9 is separated from semi-conducting material film 4 by gate dielectric material 5. The counter-electrode is formed in support substrate 2 and control of the latter is achieved by means of the support substrate contact formed from access area 15. The support substrate contact passes through gate electrode 9 and through semi-conducting material film 4 without short-circuiting with the film on the support substrate. This is achieved for example by means of protective layer 21 which electrically insulates the contact of support substrate 2 from that of semi-conducting material film 4.

This integration of the contact within gate electrode 9 and semi-conducting material film 4 enables a large gain to be made as far as the compactness of the final circuit is concerned. The surface of the device is preserved as are the electric performances compared with other architectures. It is no longer necessary to make the counter-electrode contact in the adjacent insulating pattern. This enables the dimensional constraints at the level of the insulating patterns to be reduced in the high-density areas. This also prevents problems of short-circuiting and stray capacitances in the areas where several counter-electrodes were extended to ensure dependable contact connections.

When several transistors are formed on semi-conducting material film 4, electric insulating patterns also have to be integrated. The object of these electric insulating patterns is to prevent the charge carriers from migrating in parasitic manner from one transistor to another.

Semi-conducting material film 4 is patterned so as to define active areas in which one or more transistors are formed. The complementary parts of these active areas are the insulating patterns. The insulating patterns are formed either by an electrically insulating material or by a void area, i.e. an area not filled by a solid material.

In a particular embodiment, the active area is defined after deposition of the first and second sealing materials. The active area therefore presents the same shape as the transistor. The whole of gate electrode 9 is formed above semi-conducting material film 4.

It is also possible to define the active area by means of a specific photolithography step. This step is advantageously performed before deposition of delineation material 19, if the latter is electrically insulating and is kept in the final structure. The active area can also be defined once the transistors have been produced.

It can also be envisaged to fabricate the transistor once the active areas and the insulating patterns have been formed. In this case, the part of the gate electrode that incorporates the contact area is advantageously formed above the area active.

Figure 21:
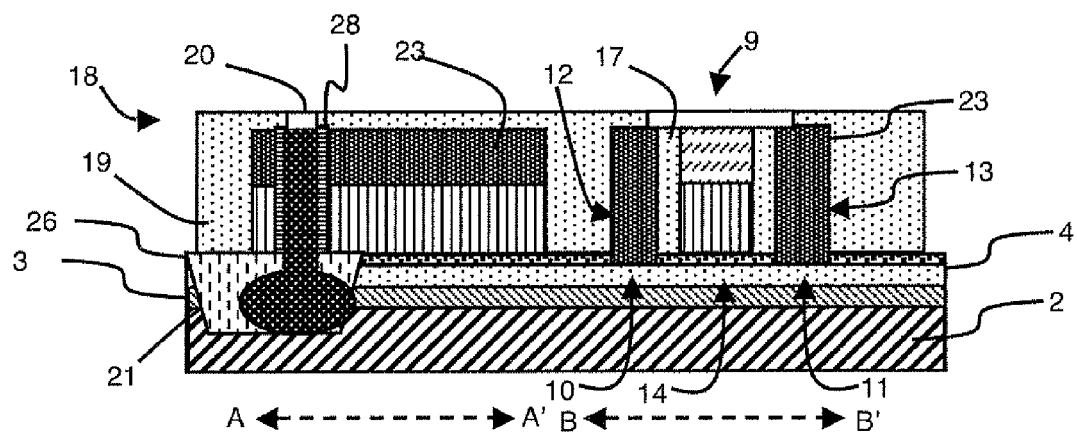
FIG. 21 represents, in schematic manner in cross-section, a further fifth alternative embodiment of a fabrication method according to the invention.

In another alternative embodiment illustrated in FIG. 21, access area 15 is located above an insulating pattern. As in the previous embodiments, gate material 6 is patterned by means of etching mask 8. The first and second sealing materials are deposited and delineation pattern 18 is formed (FIGS. 7, 8). First filling material 16 is eliminated and leaves gate material 5 or a part of the insulating pattern free. As in the previous cases, the materials located underneath the access area are eliminated to enable connection of support substrate 2.

In the particular case illustrated in FIG. 21, there is no parasite electric connection between semi-conducting film 4 and the counter-electrode contact. However, it is also possible to deposit a protective layer in order to ensure that no short-circuit exists between the counter-electrode and semi-conducting material film 4.

In the illustrated embodiment, electric connection is made from the bottom of insulating pattern 26 and from a lateral part of insulating pattern 26. It is particularly advantageous to make the connection from a side wall as the counter-electrode does not have to be extended up to underneath the insulating pattern 26. However, this embodiment is slightly more complicated to implement as the incline of the interface between insulating pattern 26 and the area active has to be taken into account when it is placed on the access area.

In preferential manner, the counter-electrodes are achieved by doping of the support substrate. In even more preferential manner, the counter-electrodes are formed when the active areas of semi-conducting material and the insulating areas are defined.

This enables self-alignment of the counter-electrodes with the active areas to be easily achieved.

In another embodiment, the counter-electrode can be aligned with the device. To do this, the contact of access area 15 is obstructed as are the spaces separating gate electrode 9 from source contact 12 and drain contact 13. Once this monoblock pattern has been formed, the semi-conductor material 4 and a part of support substrate 2 are etched by means of this pattern which limits the lateral extension of the counter-electrode to the pattern of the gate electrode and of the surface between the source and drain electrodes.

This approach enables the position of the counter-electrode contact to be defined within the pattern of the gate electrode, which is particularly advantageous when the counter-electrode is located solely underneath the gate electrode and not underneath the source and drain electrodes.

This approach also enables the nature of the material forming the counter-electrode to be changed once the device has been formed. This point is particularly advantageous when semi-conducting material 4 and the support substrate material are reactive to the same etching agent. If the counter-electrode is connected to one of the source or drain electrodes, it is not possible to eliminate the counter-electrode without also eliminating semi-conductor material 4. Destruction of the field effect transistor then occurs.

The use of a field effect transistor comprising a counter-electrode with a counter-electrode contact formed in the gate electrode is particularly interesting as it enables space-saving. The space saved is all the greater as the contact formed controls both the gate electrode and the counter-electrode. In the examples presented in top view, the counter-electrode contact is located substantially in the centre of what forms the gate head, but it is also possible to offset this contact area. This offset is all the more interesting as different contacts are formed in the case where the gate electrode and counter-electrode are electrically dissociated.

In this way, it becomes possible to produce an SRAM memory cell with four is transistors in simple and compact manner. The electric layout of this cell is disclosed in the document US2009/0129142.

Figure 22:
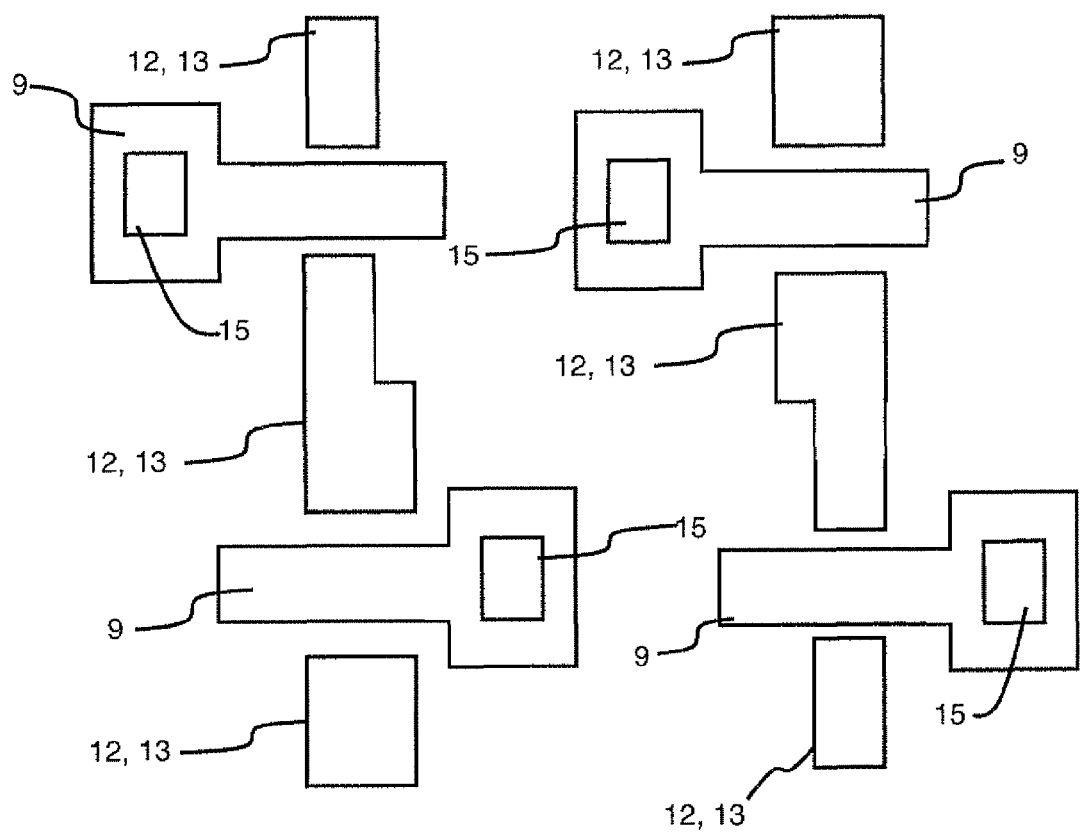
FIG. 22 represents, in top view, the pattern of an etching mask delineating four transistors provided with a counter-electrode to form a SRAM memory cell.

To obtain such a cell, it suffices to use an etching mask illustrated in FIG. 22. This mask 8 comprises the pattern of the four gate electrodes representative of the four transistors forming the memory cell. The arrangement and orientation of the different gate electrodes 9 and access areas 15 make for maximum space-saving, but other possibilities than those presented can be envisaged.

In the four-transistor SRAM memory cell, there are two NMOS transistors and two PMOS transistors. An NMOS transistor is connected in series with a PMOS transistor, so that there are two pairs of transistors connected in series. Each pair of transistors is formed on an active area, so that there are two distinct active areas in a memory cell.

As the NMOS and PMOS transistors have predefined electric performances, they have predefined dimensions as far as conduction channel length and width are concerned. One of the dimensions of the conduction channel is defined by gate electrode 9 whereas the other dimension is defined by the size of the active area. This results in the dimensions of the gate electrodes between the NMOS and PMOS transistors not having to be identical. In an advantageous embodiment already mentioned in the foregoing, the width of the active area is linked to the width of the source and drain contacts. To obtain active areas of different widths, source and drain contacts of different sizes then have to be used. The active area then comprises source and drain contacts of different sizes depending on whether they are associated with a PMOS or an NMOS transistor.

It is not compulsory for each transistor to comprise an access area due to the fact that, in the desired memory cell, there is a counter-electrode associated with an active area and therefore with two transistors. It suffices for one of the two transistors of the active area to comprise an access area. The missing electric connections are made in conventional manner by means of the electric interconnection levels. Advantageously, only the transistors whose gate electrode is electrically connected to the counter-electrode present an access area.

Thus, by means of this specific etching mask 8 and by means of the method described in the foregoing, a four-transistor SRAM memory cell having a counter-electrode that presents very good performances from an electric behavior standpoint can be obtained in simple and industrial manner.

In the embodiments described in the foregoing, the source and drain contacts are delineated at the same time as the gate electrode, which enables fast and efficient self-alignment of the different electrodes. It can also be envisaged to delineate the source or drain contacts before or after delineation of the gate electrode. In this case, there is pre-delineation in the gate material by means of a broader pattern than the final delineation of the electrode which is to be formed subsequently. It can also be envisaged to form the source and drain contacts in a different manner, typically in conventional manner.

The invention claimed is:

1. A method for fabricating a field effect transistor comprising the following steps:
   providing a substrate comprising successively a support substrate, a dielectric material layer, a layer of semi-conducting material, a layer of gate material, an etching mask wherein the etching mask defines a gate electrode pattern and a counter-electrode contact pattern located inside the gate electrode pattern,
   etching the gate material by means of the etching mask so as to define a gate electrode in the gate material and a counter-electrode contact area in the gate material, the counter-electrode contact area being surrounded by the gate electrode,
   forming a counter-electrode contact in the support substrate, the counter-electrode contact passing through the gate material by means of the counter-electrode contact area.

2. The method according to claim 1 comprising forming a protective layer in the counter-electrode contact area, the protective layer covering the semi-conductor material layer and uncovering a part of the support substrate.

3. The method according to claim 1 wherein the etching mask defines a source contact and a drain contact so as to form a source contact made of gate material and a drain contact made of gate material, when etching of the gate material is performed by means of the etching mask.

4. The method according to claim 3 comprising depositing a filling material so as to fill a space situated between the gate electrode and the source and drain contacts after etching of the gate material is performed.

5. The method according to claim 4 comprising etching of the semi-conductor material layer after depositing the filling material is performed.

6. The method according to claim 1 comprising filling the counter-electrode contact area by a sacrificial material.

7. The method according to claim 6 comprising depositing a delineation material so as to cover the gate material and etching the delineation material so as to access to a part of sacrificial material, to a part of the source contact and to a part of the drain contact made of gate material.

8. The method according to claim 7 comprising simultaneously forming the counter-electrode contact and source and drain contacts by depositing an electrical conductive material.

9. The method according to claim 2 wherein uncovering a part of the support substrate comprises isotropic etching of the semi-conducting material.

10. The method according to claim 2 wherein uncovering a part of the support substrate comprises isotropic etching of the dielectric material layer located between a semi-conducting material layer and a gate material.

11. A field effect transistor comprising:
    a support substrate,
    a dielectric material film,
    a semi-conducting material film separated from the support substrate by the dielectric material layer,
    a gate electrode separated from the semi-conducting material film by a gate dielectric material,
    an electric contact of the support substrate,
    a transistor wherein the electric contact of the support substrate passes through the gate electrode and through the semi-conducting material film.

12. The transistor according to claim 11 wherein a protective film electrically insulates the electric contact of the support substrate from the semi-conducting material film.

* * * * *